United States Patent
Ryu

(10) Patent No.: US 7,713,777 B2
(45) Date of Patent: May 11, 2010

(54) METHOD FOR MANUFACTURING IMAGE SENSOR

(75) Inventor: Sang Wook Ryu, Cheongju-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 12/200,961

(22) Filed: Aug. 29, 2008

(65) Prior Publication Data
US 2009/0061556 A1 Mar. 5, 2009

(30) Foreign Application Priority Data
Aug. 31, 2007 (KR) .............. 10-2007-0088256

(51) Int. Cl.
*H01L 21/00* (2006.01)
(52) U.S. Cl. ............ 438/70; 438/57; 257/E31.127
(58) Field of Classification Search ............ 438/70, 438/57, 69
See application file for complete search history.

(56) References Cited

U.S. PATENT DOCUMENTS 5,384,231 A * 1/1995 Johnson et al. .......... 430/321

2007/0161147 A1* 7/2007 Kim ..................... 438/70
2008/0315341 A1* 12/2008 Lee ...................... 257/432
2009/0032895 A1* 2/2009 Park ..................... 257/432

FOREIGN PATENT DOCUMENTS

| KR | 10-2005-0057968 | 6/2005 |
| KR | 10-2006-0010879 | 2/2006 |
| KR | 10-2006-0091518 | 8/2006 |
| KR | 10-2007-0069361 | 7/2007 |

* cited by examiner

*Primary Examiner*—Walter L Lindsay, Jr.
*Assistant Examiner*—Reema Patel
(74) *Attorney, Agent, or Firm*—Saliwanchik, Lloyd & Saliwanchik

(57) ABSTRACT

A method for manufacturing an image sensor according to an embodiment includes performing a plasma surface treatment on an oxide film microlens to mitigate high surface morphology. The image sensor can include a passivation layer on a substrate having a pad region and a pixel region and a color filter layer on the passivation layer. A first low temperature oxide can be formed over the substrate including the color filter layer; and an oxide film microlens can be formed on the first low temperature oxide layer. A portion of the first low temperature oxide layer can provide a seed microlens upon which a second low temperature oxide layer is formed to form the oxide film microlenses. The plasma surface treatment can then be applied with respect to the oxide film microlenses.

14 Claims, 4 Drawing Sheets

METHOD FOR MANUFACTURING IMAGE SENSOR

CROSS-REFERENCE TO RELATED APPLICATION

The present application claims the benefit under 35 U.S.C. §119 of Korean Patent Application No. 10-2007-0088256, filed Aug. 31, 2007, which is hereby incorporated by reference in its entirety.

BACKGROUND

In general, a microlens of an image sensor device is used to induce light incident from the outside into a photodiode. To this end, a typical microlens is generally manufactured through a photo process using organic-based materials.

However, the related art microlens introduces several sensitivities including contamination of the microlens due to particles generated in a wafer sawing process, and an attack of a pad layer when forming the microlens. These sensitivities degrade manufacturing yield.

Also, in many applications, a zero gap between microlenses is desired to reduce photon loss transferred to a pixel. However, the related art using the existing organic microlens has difficulties realizing a zero gap.

Further, the related art often uses a polymer-based planarization layer to remove a step difference generated upon forming a color filter. However, a vertical scale is increased by the addition of a planarization layer. The increased vertical scale can degrade image characteristics.

Thus, there exists a need in the art for an improved image sensor and method of manufacturing the same.

BRIEF SUMMARY

Embodiments of the present invention provide a method for manufacturing an image sensor adopting a microlens using an oxide film.

Embodiments of the present invention also provide a method for manufacturing an image sensor that does not need to include a polymer-based planarization layer.

Additionally, embodiments of the present invention can provide a method for manufacturing an image sensor capable of minimizing the gap between microlenses.

Further, an embodiment of the present invention provides a method for manufacturing an image sensor capable of mitigating the surface morphology of a microlens.

A method for manufacturing an image sensor according to an embodiment can include: forming a passivation layer on a substrate including a pad region and a pixel region; forming a color filter layer on the passivation in the pixel region; forming a first low temperature oxide over the substrate including the color filter layer; forming an oxide film microlens on the first low temperature oxide; and performing a plasma surface treatment on the oxide film microlens.

DETAILED DESCRIPTION

Hereinafter, a method for manufacturing an image sensor according to an embodiment will be described with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

Figure 1:
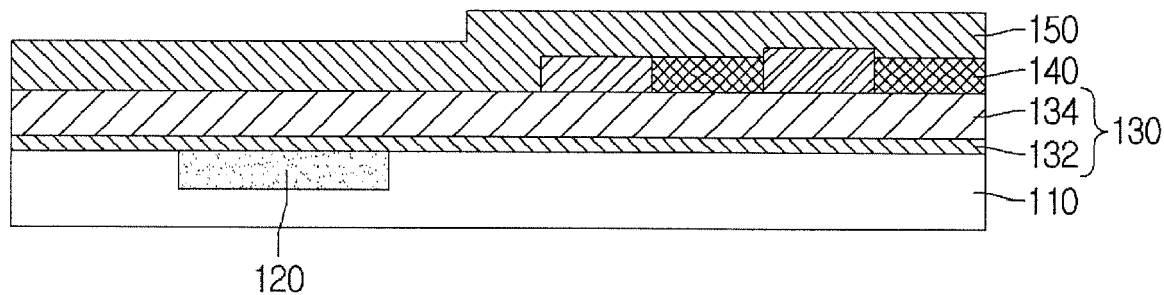
FIGS. 1 to 7 are cross-sectional views of a method for manufacturing an image sensor according to an embodiment of the present invention.

Referring to FIG. 1, a passivation layer 130 can be formed on a substrate 110 including a pad region 120 and a pixel region. In addition, although not illustrated in the figures, persons of ordinary skill in the art will appreciate that the substrate 110 can include structures such as metal interconnections, interlayer dielectric layers, transistors, diffusion regions, and so forth.

The passivation layer 130 can be formed of any suitable material known in the art.

In one embodiment, the passivation layer 130 can include an oxide film 132 and a nitride film 134.

For example, the oxide film 132 can be formed of tetraethylorthosilicate (TEOS) and can have a thickness of about 1,000 Å to about 5,000 Å. In addition, the nitride film 134 can have a thickness of about 1,000 Å to about 10,000 Å.

Then, a color filter layer 140 can be formed on the passivation layer 130. The color filter layer 140 can be formed by any suitable process known in the art. For example, a dyeable resist can be coated on the passivation layer 130, and then subjected to exposure and development processes to form the color filter layer 140. The color filter layer 140 can be red, green, and blue color filter layers filtering light according to wavelength band.

According to embodiments, a coating of a polymer-based planarization material for mitigating a step difference of a color filter layer 140 can be omitted. Instead, a first low temperature oxide (LTO) 150 can be directly formed on the color filter layer 140.

In one embodiment, the first low temperature oxide 150 can be deposited at a temperature of between about 150° C. and about 300° C. For example, the first low temperature oxide 150 can be formed at a temperature of about 180° C. Of course, embodiments are not limited thereto.

The first low temperature oxide 150 can include any suitable material known in the art and can be formed by any suitable process known in the art. For example, the first low temperature oxide can be formed of silicon dioxide ($SiO_2$). Additionally, the first low temperature oxide 150 can be formed by, for example, chemical vapor deposition (CVD), physical vapor deposition (PVD), or plasma enhanced chemical vapor deposition (PECVD).

In certain embodiments, there may be an irregularity (not shown) in the first low temperature oxide 150. That is, a step difference may exist at a surface of the first low temperature oxide 150 due to the color filter layer 140.

Accordingly, the first low temperature oxide 150 can be planarized.

According to an embodiment, one method for planarizing the first low temperature oxide 150 can include a chemical dry etching.

For example, a method for planarizing the first low temperature oxide 150 can be a chemical dry etching using $C_xF_y$ gas (where x and y are integers). In one embodiment, the chemical dry etching can be preformed using $CF_4$ gas. In a further embodiment, the chemical dry etching can include forming plasma at several mTorr using a microwave.

In another embodiment, a method for planarizing the first low temperature oxide 150 can include a plasma etching.

For example, the plasma etching can be an isotropic etch applying only a capacitively coupled plasma (ccp) type source power. For example, the plasma etching can utilize an enhanced isotropic characteristic by applying the source power of several tens to several hundreds of Watts. The plasma etching can also use $C_xF_y$ based gas (where x and y are integers) while using pressure of several hundreds of mTorr.

Figure 2:
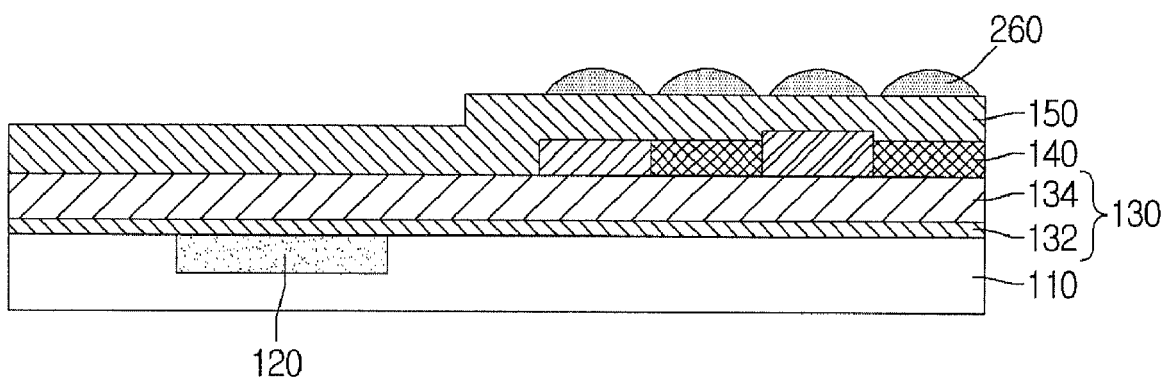

Referring to FIG. 2, an organic microlens pattern 260 can be formed on the first low temperature oxide 150.

The organic microlens pattern 260 can be formed using any suitable method known in the art. For example, an organic photosensitive film pattern (not shown) can be formed on the first low temperature oxide 150. Then, the organic photosensitive pattern can be subjected to a reflowing process by a heat treatment at a temperature of 150° C. or more using, for example, a hot plate to form a semi-spherical shaped microlens pattern 260.

Figure 3:
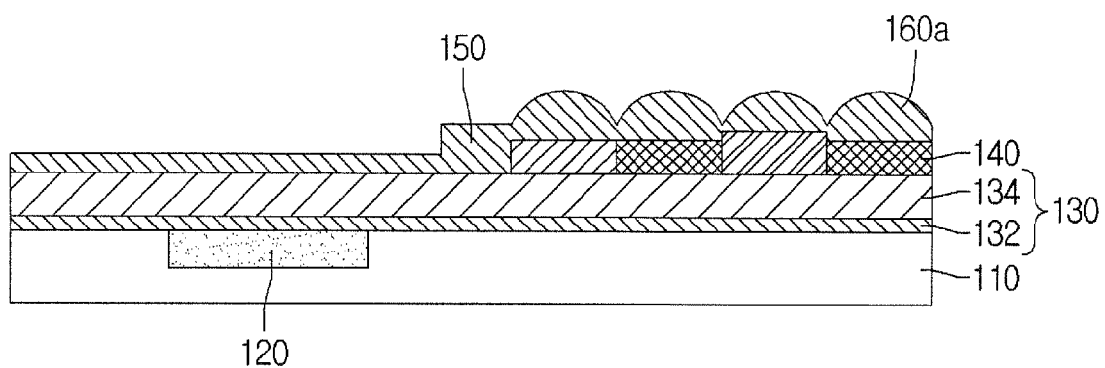

Then, referring to FIG. 3, the first low temperature oxide 150 can be selectively etched using the organic microlens pattern 260 as an etch mask to form a seed microlens 160a in the pixel region.

During the forming of the seed microlens 160a in the pixel region by selectively etching the first low temperature oxide 150, the selective etch of the first low temperature oxide 150 can be progressed in an atmosphere of about 40 sccm to about 120 sccm of $CF_4$ and about 2 sccm to about 20 sccm of $O_2$.

In an embodiment, the seed microlens 160a can be formed by etching the first low temperature oxide 150 by about 1,000 Å to about 19,000 Å by using an etching gas of $C_xH_yF_z$ (where x, y, and z are non-negative integers, i.e., 0, 1, 2, etc.) and atoms or molecules of $O_2$ or an inert gas such as Ar, He, and/or $N_2$.

In certain embodiments, the etching selectivity (ratio) of the organic microlens pattern 260 and the first low temperature oxide film layer 150 can be between about 1:0.7 to about 1:1.3. For example, the etching selectivity of the first low temperature oxide layer 150 to the organic microlens pattern 260 can have a margin of about +/−30%.

In one embodiment, the seed microlens 160a can have a height to between about 2,000 Å and about 6,000 Å.

Figure 4:
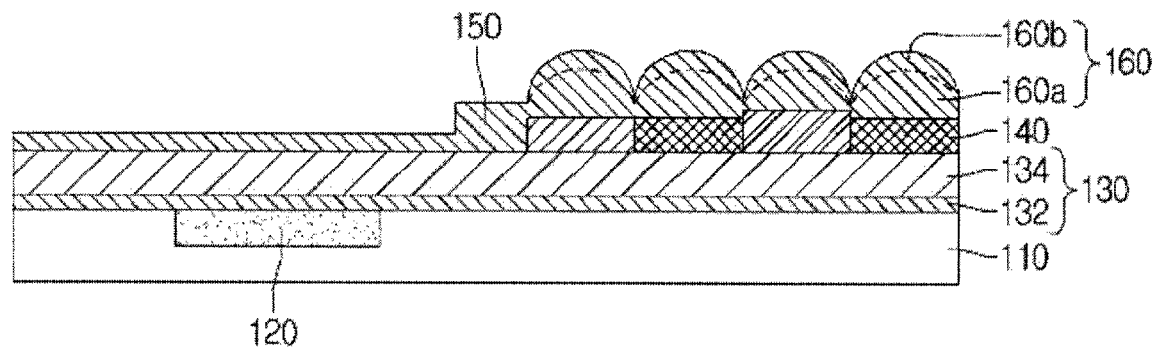

Referring to FIG. 4, a second low temperature oxide 160b can be formed on the seed microlens 160a in the pixel region to form the low temperature oxide film microlens 160.

In an embodiment, the second low temperature oxide 160b can be formed to a thickness of about 500 Å to about 20,000 Å. According to embodiments, the second low temperature oxide 160b can be deposited to form a gapless microlens. The second low temperature oxide 160b can be used to reduce any gaps remaining between seed microlenses 160a.

Figure 5:
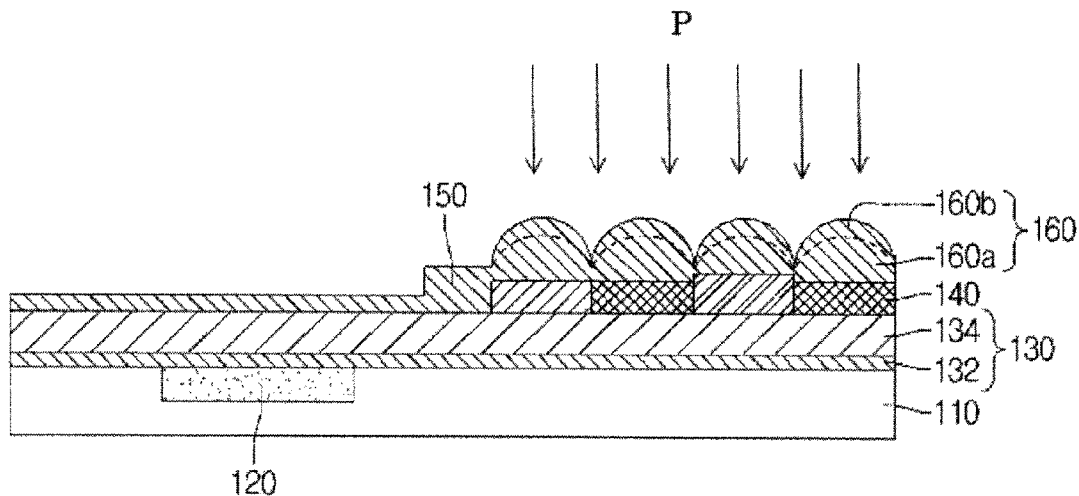

Next, referring to FIG. 5, the oxide film microlens 160 can be subjected to a plasma surface treatment (P).

Because the oxide film microlens 160 can be formed at a low temperature of 300° C. or less, the oxide film microlens 160 may have a high surface morphology. If the surface morphology of the microlens is high, photodiodes in adjacent pixels can be affected by a scattering of light by the high surface morphology of the microlens, and the transfer efficiency of the photodiodes can be degraded.

Therefore, by subjecting the oxide film microlens 160 to the surface treatment (P) as described in embodiments of the present invention, the surface morphology can be mitigated to reduce the scattering of light, making it possible to improve condensing efficiency of the microlens.

In one embodiment, the plasma surface treatment P can be performed by injecting an inert gas, such as Ar, He, and/or Xe, into a chamber for applying the plasma surface treatment, ionizing the injected gases to provide the plasma, and etching the surface of the oxide microlens 160 by about 5 Å to about 5,000 Å, making it possible to mitigate the surface morphology of the oxide film microlens 160. The etching can be accomplished using the ionized gases.

In another embodiment, the plasma treatment P can be performed by injecting halogen gas, such as Cl, F, and/or Br, into a chamber for applying the plasma surface treatment, ionizing the injected gases to provide the plasma, and etching the surface of the oxide microlens 160 by about 5 Å to about 5,000 Å, making it possible to mitigate the surface morphology of the oxide film microlens 160. The etching can be accomplished using the ionized gases.

In yet another embodiment, the plasma treatment P can be performed by injecting and ionizing inert gases and halogen gases to provide the plasma for the plasma surface treatment, and etching the surface of the oxide microlens 160 by about 5 Å to about 5,000 Å, making it possible to mitigate the surface morphology of the oxide film microlens 160. The etching can be accomplished using the ionized gases.

Figure 6:
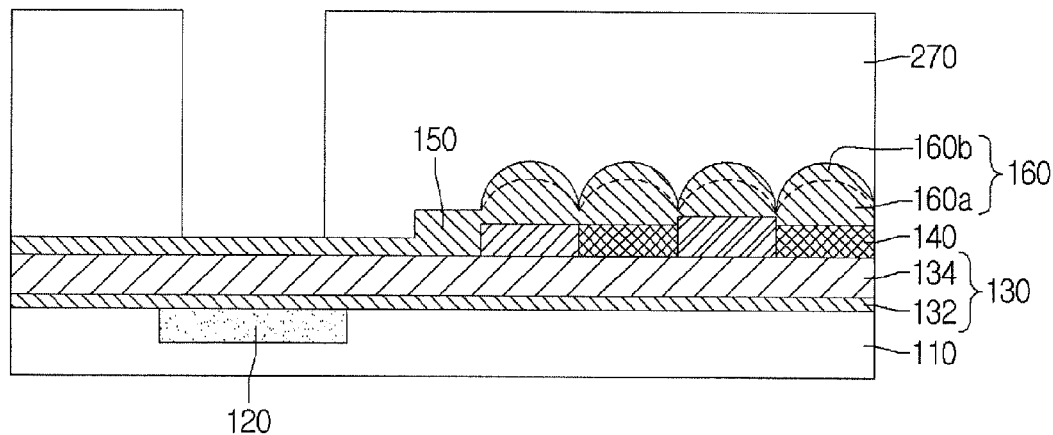

Next, referring to FIG. 6, a pad mask pattern 270 can be formed to open the pad region 120.

For example, a pad mask pattern 270 exposing the first low temperature oxide 150 above the pad can be formed.

Figure 7:
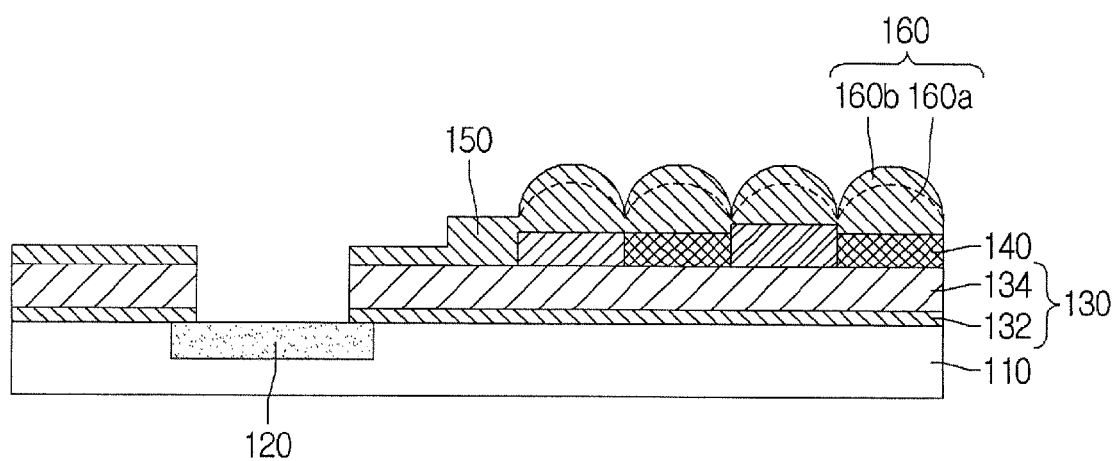

Next, referring to FIG. 7, the exposed first low temperature oxide 150 can be selectively etched using the pad mask pattern 270 as an etch mask, making it possible to open the pad region 120. For example, the etching condition for opening the pad region 120 can depend on the etching conditions of the seed microlens 160a. That is, an etching gas of $C_xH_yF_z$ (where x, y, and z are non-negative integers, i.e., 0, 1, 2, etc.) and atoms or molecules of $O_2$ or an inert gas such as Ar, He, and/or $N_2$ can be used in certain embodiments.

The method for manufacturing the image sensor according to an embodiment can omit a polymer-based planarization layer.

Also, according to an embodiment, a gapless microlens can be formed by using the oxide film, making it possible to reduce photon loss.

In addition, a hard microlens can be provided by using oxide film, making it possible to inhibit defect occurrence caused by a package process or a bump process.

Further, a continuous type microlens can be formed, making it possible to provide the same focal length in all directions.

According to embodiments of the present invention, the surface morphology of the microlens can be mitigated by performing a plasma treatment on the oxide microlens to reduce the scattering of light, making it possible to improve the condensing efficiency of the oxide microlens.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing an image sensor, comprising:
    forming a passivation layer on a substrate having a pad region and a pixel region;
    forming a color filter layer on the passivation layer;
    forming a first low temperature oxide layer over the substrate including the color filter layer;
    forming an oxide film microlens on the first low temperature oxide layer; and
    performing a plasma surface treatment on the oxide film microlens,
    wherein performing the plasma surface treatment etches the surface of the oxide film microlens by about 5 Å to about 5,000 Å.

2. The method according to claim 1, further comprising planarizing the first low temperature oxide layer.

3. The method according to claim 2, wherein planarizing the first low temperature oxide layer comprises performing a chemical dry etching.

4. The method according to claim 2, wherein planarizing the first low temperature oxide layer comprises performing a plasma etching.

5. The method according to claim 1, wherein forming the oxide film microlens comprises:
    selectively etching the first low temperature oxide layer to form a seed microlens.

6. The method according to claim 5, wherein selectively etching the first low temperature oxide layer to form the seed microlens comprises:
    forming an organic microlens pattern on the first low temperature oxide layer in the pixel region; and
    etching the first low temperature oxide layer using the organic microlens pattern as an etch mask.

7. The method according to claim 6, wherein the during the etching of the first low temperature oxide layer, the etching selectivity of the organic microlens pattern and the first low temperature oxide layer is between about 1:0.7 and about 1:1.3.

8. The method according to claim 5, wherein forming the oxide film microlens further comprises depositing a second low temperature oxide layer on the seed microlens.

9. The method according to claim 8, wherein performing the plasma surface treatment comprises:
    using ionized inert gas to etch the surface of the oxide film microlens.

10. The method according to claim 8, wherein performing the pin surface treatment comprises:
    using ionized halogen group elements to etch the surface of the oxide film microlens.

11. The method according to claim 8, wherein performing the pin surface treatment comprises:
    using a combination of ionized inert gases and halogen group elements to etch the surface of the oxide film microlens.

12. The method according to claim 1, wherein performing the plasma surface treatment comprises:
    using ionized inert gas to etch the surface of the oxide film microlens.

13. The method according to claim 1, wherein performing the plasma surface treatment comprises:
    using ionized halogen group elements to etch the surface of the oxide film microlens.

14. The method according to claim 1, wherein performing the pin surface treatment comprises:
    wing a combination of ionized inert gas and halogen group elements to etch the surface of the oxide film microlens.

* * * * *